United States Patent
Rochard

[19]

[11] Patent Number: 6,104,634
[45] Date of Patent: Aug. 15, 2000

[54] ELECTRICAL PROGRAMMABLE NON-VOLATILE MEMORY INTEGRATED CIRCUIT WITH OPTION CONFIGURATION REGISTER

[75] Inventor: Laurent Rochard, Cabries, France

[73] Assignee: SGS-Thomson Microelectronics S.A., Gentilly, France

[21] Appl. No.: 09/087,415

[22] Filed: May 29, 1998

[30] Foreign Application Priority Data

Jun. 4, 1997 [FR] France ................................ 97 06893

[51] Int. Cl.[7] .................................................. G11C 7/00
[52] U.S. Cl. .............................. 365/185.05; 365/185.25; 365/201
[58] Field of Search .............................. 365/201, 185.05, 365/185.25, 189.01, 189.03

[56] References Cited

U.S. PATENT DOCUMENTS

| 4,168,537 | 9/1979 | Uchida ................................ 365/184 X |
| 4,300,212 | 11/1981 | Simko ................................ 365/185.08 |
| 4,571,709 | 2/1986 | Skupnjak et al. .................... 365/189.08 |
| 4,635,229 | 1/1987 | Okumura et al. .................... 365/185.07 |
| 5,572,707 | 11/1996 | Rozman et al. ..................... 395/497.01 |
| 5,602,776 | 2/1997 | Herdt et al. ..................... 365/185.05 X |
| 5,606,523 | 2/1997 | Mirabel .............................. 365/185.05 |
| 5,696,716 | 12/1997 | Rolandi .......................... 365/185.05 X |

FOREIGN PATENT DOCUMENTS

| 420388 | 4/1991 | France . |
| 0698890 | 2/1996 | France . |

*Primary Examiner*—Do Hyun Yoo
*Attorney, Agent, or Firm*—Theodore E. Galanthay; Gunster, Yoakley, Valdes-Fauli & Stewart

[57] ABSTRACT

An electrically programmable non-volatile memory integrated circuit includes: read/write resources; a first bit line; a second bit line; an option configuration register consisting of at least one bit; a reading mechanism; and a writing mechanism. The option configuration register includes, for the at least one bit: a bistable element including at least one memory cell, and a static memory element. The at least one memory cell is coupled to the first bit line and to the second bit line, and the static memory element is coupled to the bistable element. The reading mechanism is for reading a state of the static memory element, and it utilizes the first and second bit lines and the read/write resources. The writing mechanism is for setting the state of the static memory element, and it utilizes the first and second bit lines and the read/write resources.

8 Claims, 3 Drawing Sheets

ELECTRICAL PROGRAMMABLE NON-VOLATILE MEMORY INTEGRATED CIRCUIT WITH OPTION CONFIGURATION REGISTER

CROSS REFERENCE TO RELATED APPLICATIONS

This application is based upon and claims the benefit of the priority of the prior French patent application 97 06893 filed on Jun. 4, 1997, the contents of which are incorporated by reference herein.

BACKGROUND OF THE INVENTION

1. Field of the Invention

The present invention relates to an electrically programmable non-volatile memory type integrated circuit with option configuration register. It can be applied especially but not exclusively in the field of EPROMs.

An integrated circuit with memory generally offers a certain number of options to the user. Depending on his application, the user will thus select one option or another. He may for example choose between a crystal oscillator or a ring oscillator (RC) or he may choose between a hardware watchdog or software watchdog function or he may choose to enable or disable a read protection for all or a part of the contents of the memory or again he may select an input/output port among several possibilities. This list of options is not exhaustive and many other options are offered in practice. To each option, therefore, there must correspond one or more configuration bits. These bits are contained in an option configuration register made by means of cells of the memory, arranged in the form of bistable cells.

At the end of the manufacture of the integrated circuit, it must be tested completely in every possible configuration before being supplied to the user. To perform this test, it is necessary therefore to program the option configuration register suitably for each configuration.

For the cells of a one-time programmable memory (OTP memory), it is not possible to proceed in this way by successive operations for the programming of all the possible combinations. This is why testing means are associated with the bistable memory cell elements to set the state of the configuration bits without programming the memory cells of the register. It is thus possible to test the different options in every possible configuration without affecting the memory cells.

2. Description of the Prior Art

An example of a configuration register of this kind is shown in FIG. 1. In this example, the memory is an EPROM type electrically programmable memory whose erasure by ultraviolet rays is prevented by the use of a windowless plastic encapsulation pack. It will be noted that there are other types of one-time programmable memories but they will not be discussed.

The memory (not shown) is usually organized in bit lines (or columns) and word lines (or rows).

A stage of the configuration register corresponding to a bit comprises a bistable stage 1 followed by a static memory stage 2 with inverters.

The bistable stage 1 has two arms Ba and Bb. The first arm Ba is connected to a bit line BLa of the memory by a first transistor T1. The second arm Bb is connected to another bit line BLb by a second transistor T2. These two transistors which are N type transistors in the example are controlled by a signal for the selection of the bistable stage, referenced EPSEL in the figure.

In each arm, there are two transistors and one memory cell series-connected between the logic supply voltage Vcc and the ground. In the example, there is a P type transistor whose source is connected to Vcc and an N type transistor between the P type transistor and the cell. The gate of the P type transistor of one arm is connected to the drain of the N type transistor of the other arm. The gate of the N type transistor of each arm is controlled by the same control signal referenced VDR, whose level is a function of the operation to be performed. The selection transistor associated with an arm is connected to the connection point between the N type transistor and the memory cell of this arm (namely to the drain of the memory cell). The transistor T1 is thus connected to the connection point N1 of the arm Ba and the transistor T2 is connected to the connection point N2 of the arm Bb.

Finally, the memory cells are controlled at their gate by a control signal WL.

The output of the bistable stage 1 is taken at either arm, at the connection point of the two transistors (i.e., in the example at the drain of an N type transistor).

In the arm Ba, between Vcc and the ground, there are thus a P type transistor T3, an N type transistor T4 and a memory cell C1. In the arm Bb, similarly there is a P type transistor T5, an N type transistor T6 and a memory cell C2.

The output S1 of the bistable stage 1 is taken at the node N3 of the arm Bb corresponding to the drain of the transistor T6.

The two cells are blank at the end of manufacture. If a read voltage is applied to their gate (signal WL), then they are on and the output S1 remains at zero volts. If the cell C1 is programmed, the cell C2 remains blank, and the cell C1 goes off, but since the cell C2 is on, the output S1 remains at zero.

If it is the cell C2 that is programmed, with the cell C1 remaining blank, the output S1 will rise substantially to Vcc (in fact Vcc−Vtp, Vtp being the threshold voltage of the P type transistor).

The complementary programming of the memory cells C1 and C2 is done by applying a high programming voltage, generally referenced Vpp, to the bit line associated with the cell to be programmed by means of the switching transistors T1 and T2 and by taking the gate control signal WL of the cells (EPROM memory) to Vpp. At the same time, the gate control signal VDR of the N type transistors is set at zero so as to disconnect the P type and N type transistors of each cell during the programming.

The application of the high voltage to the bit line to be programmed is done in a known way by means of a high voltage switch associated with a data input register for the input of data to be programmed and a bit line address decoder.

The testing means associated with this bistable stage 1 include a static memory stage 2 and means 3 to set the output of the bistable stage at a determined level independently of the memory cell.

The static memory stage 2 includes in a conventional way a first inverter 4 between the terminal Q and a terminal /Q and a second inverter 5 between the terminal /Q and the terminal Q. In the example, the terminal Q is connected to the output S1 of the bistable stage 1 and the terminal /Q is used as an output terminal Bout leading towards the options. A transfer gate PG1 is planned between the output of the second inverter 5 and the Q input of the first inverter. This transfer gate which conventionally has a P type transistor and an N type transistor that are parallel-connected, is controlled by a signal STAT.

In operational mode, the transfer gate PG1 is open (open circuit) and the inverter 4 follows the level of the output S1 of the bistable element with memory cells for the delivery, at output Bout, of a complementary level towards an option configuration input of the integrated circuit.

In the mode for the testing (reading and programming) of the static memory element, the gate PG1 is turned on (closed) to store a specified state with the second inverter.

The testing means include means to set the output level S1 of the bistable element independently of the memory cell. They consist of a transistor parallel-connected with each cell. We thus have the N type transistor T7 parallel-connected with a cell C1 and the N type transistor T8 parallel-connected with the cell C2. These transistors are respectively controlled at their gates by a signal $test_a$ and a signal $test_b$.

In test mode, these two signals are complementary to one another so that a single transistor is on while the other is off. During this test, the two memory cells have their gates set at zero by the signal WL so that they are off. In this way, it is possible to simulate the two possible states in the bistable state, by turning on either the transistor T7 of the arm Ba or the transistor T8 of the arm Bb. In the static memory element, the transfer gate PG1 is turned on (short-circuited) so that the second inverter 5 confirms the level of S1.

In operational mode, the two signals $test_a$ and $test_b$ are set at zero to turn the two transistors T7 and T8 off.

A structure of this kind proves to be inefficient in practice. Indeed, for each configuration bit, it is necessary to have two test lines: $test_a$ and $test_b$, with an associated test register. Since a configuration register usually has more than 8 bits, this amounts to a minimum of 16 test lines and two 8-bit test registers. Furthermore, topologically, the memory cells used in the configuration register are located at the end of the bit lines whereas all the registers are brought together at the head of the bit lines.

The making of the structure in practice is therefore highly demanding in terms of requirements of integrated circuit surface area. This entails the necessary limiting (to four, for example) of the number of test lines used to test the bits of the configuration register. There follows a severe limitation of the test cover available since it is no longer possible to test each bit and each option independently of the others.

SUMMARY OF THE INVENTION

Briefly, according to one aspect of the invention, an electrically programmable non-volatile memory integrated circuit comprises: read/write resources; a first bit line; a second bit line; an option configuration register consisting of at least one bit; a reading mechanism; and a writing mechanism. The option configuration register comprises, for the at least one bit: a bistable element comprising at least one memory cell, and a static memory element. The at least one memory cell is coupled to the first bit line and to the second bit line, and the static memory element is coupled to the bistable element. The reading mechanism is for reading a state of the static memory element, and it utilizes the first and second bit lines and the read/write resources. The writing mechanism is for setting the state of the static memory element, and it utilizes the first and second bit lines and the read/write resources.

Briefly, according to other aspects of the invention, there are provided a method and a computer readable medium corresponding to the above circuit.

BRIEF DESCRIPTION OF THE DRAWINGS

Other features and advantages of the invention are described in detail in the following description given by way of a non-restrictive indication with reference to the appended drawings, of which.

DETAILED DESCRIPTION OF AN EMBODIMENT

1. Overview

In the invention, it has been sought to resolve this problem of testing the configuration register and the options in another way that enables full test cover. It has been realized that the limitations of the prior art structure were due to the fact that the static memory element was set through the bistable element making it necessary, so to speak, to duplicate all the bit lines BLa–BLb associated with the configuration register to have the necessary test lines $test_a$ and $test_b$.

In the invention, another means is sought to set the static memory element independently of the bistable element with memory cells.

A solution has been found to this technical problem enabling the use of the resources of the memory to gain access to static memory elements.

An object of the invention therefore is an electrically programmable non-volatile memory integrated circuit with an option configuration register comprising, for each bit, a bistable element with cells of the memory, connected to a first bit line and a second bit line of the memory followed by a static memory element. The memory comprises read/write resources.

According to the invention, means are planned to connect said static memory element to the first bit line and the second bit line so as to read or set a state of said static memory element by means of these bit lines and the read/write resources of the non-volatile memory.

2. Operation

Figure 1:
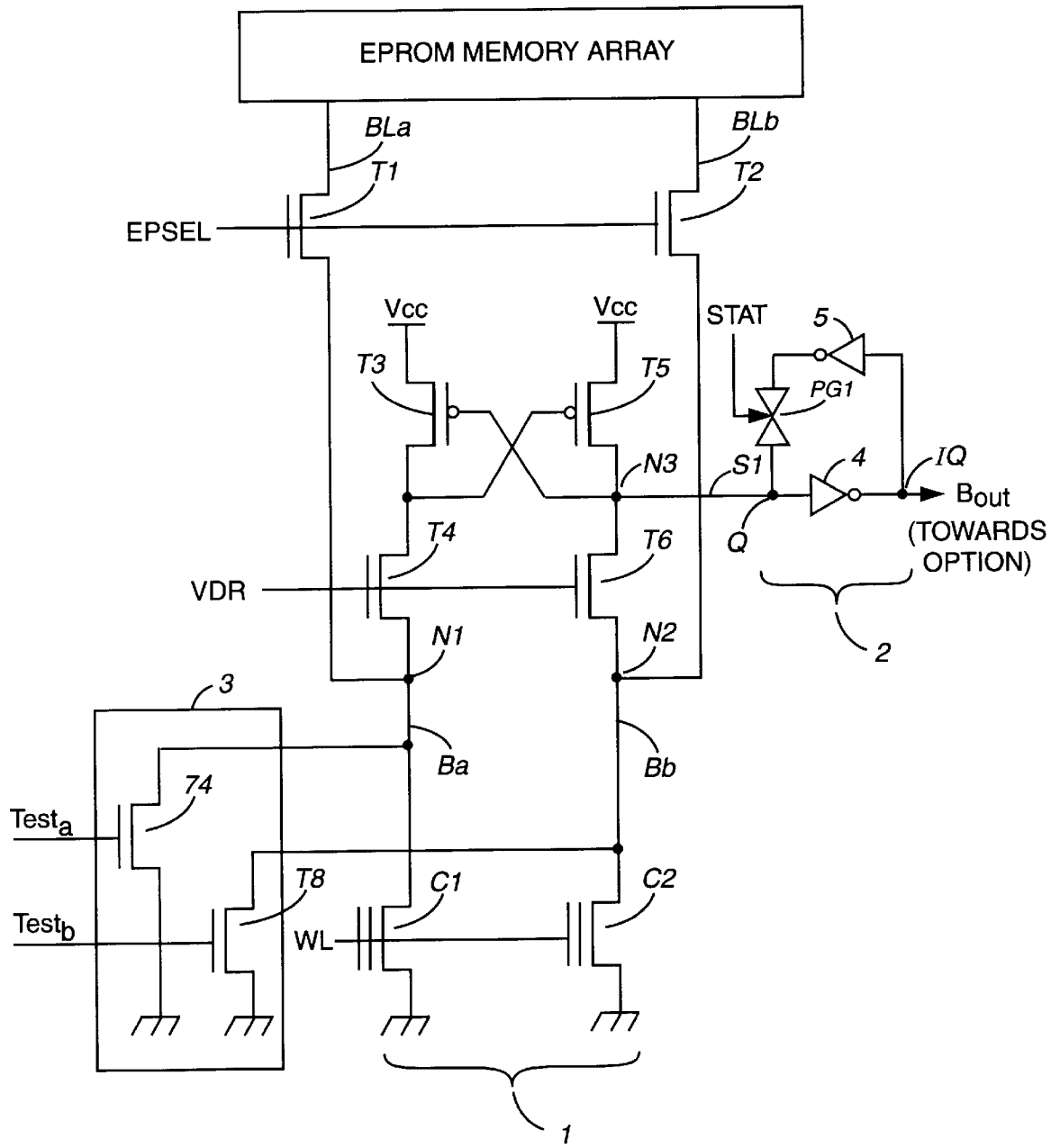
FIG. 1 already described shows the structure of a stage of the prior art configuration register.
Figure 2:
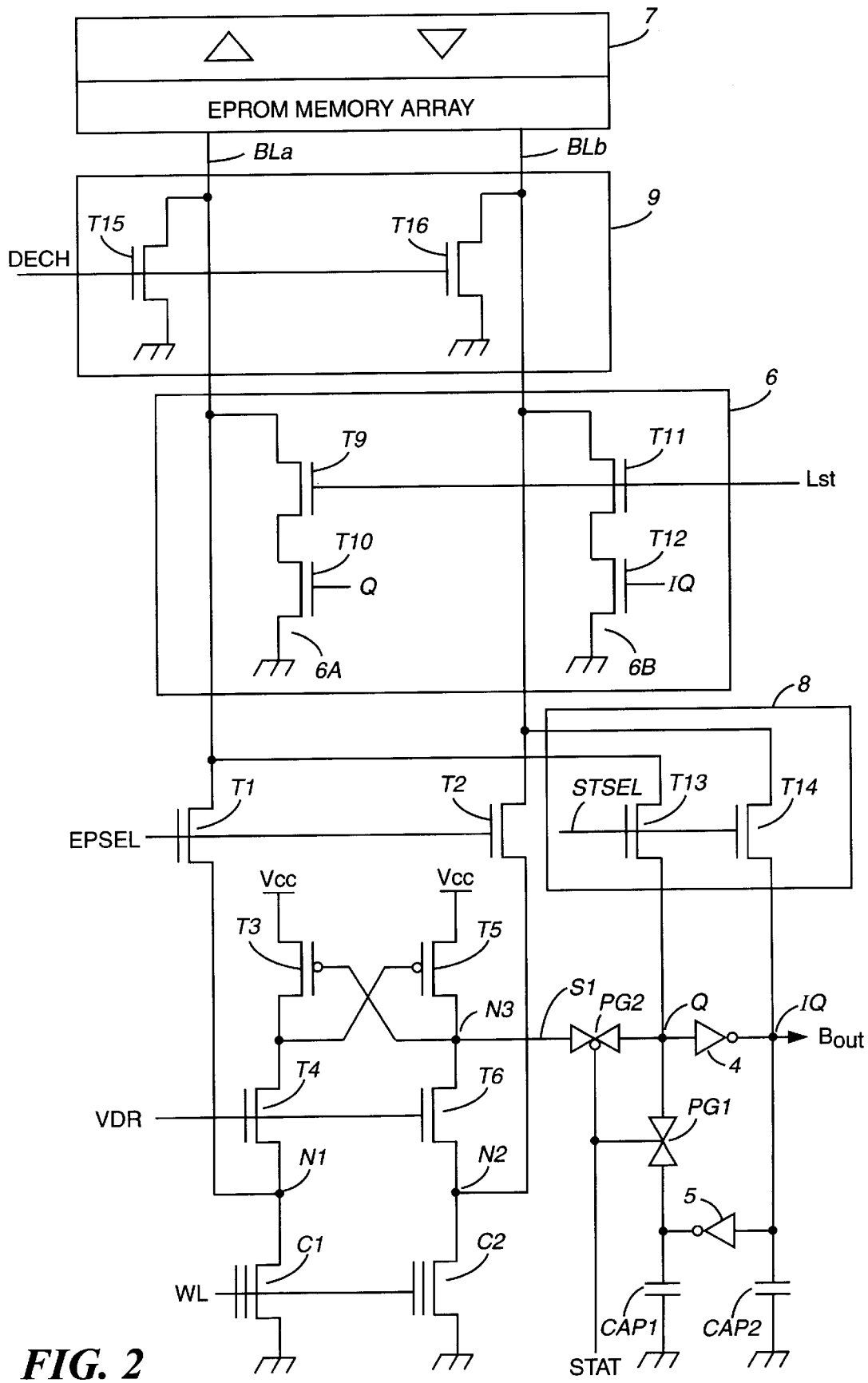
FIG. 2 shows a structure of a stage of the configuration register according to the invention.

FIG. 2 shows a structure of a stage of the configuration register according to the invention. The elements common with FIG. 1 bear the same references. As in the preceding case, the register has a bistable element 1 with memory cells C1, C2 and a static memory 2 with inverters 4 and 5. To test the configuration register and the options, it uses the resources of the memory, namely the bit lines and the read/write circuits (comprising in particular a high voltage switch Vpp) to which these lines are connected. To read the static memory element, read means 6 are planned. They comprise a circuit 6a associated with the terminal Q of the static memory element and a circuit 6b associated with the terminal /Q.

The circuit 6a has two transistors T9 and T10 series-connected between the bit line BLa and the ground. The transistor T9 connected to the bit line is controlled at its gate by a read test signal LST. The transistor T10 connected to the ground has its gate connected to the terminal Q of the static memory element.

The circuit 6b has two transistors T11 and T12 series-connected between the bit line BLb and the ground.

The transistor T11 connected to the bit line is controlled at its gate by the read test signal LST. The transistor T12 connected to the ground has its gate connected to the terminal /Q of the static memory element. In the example, the transistors T9 to T12 are N type transistors.

Let it be assumed that the static memory element has been set at "1" at its terminal Q. If this element is selected in read test mode, there will be a voltage of the order of Vcc at the transistor T10. The read test signal LST is active (at Vcc). And the bit line BLa itself is selected in read mode (at Vcc).

The transistors T9 and T10 are then on. A current flows in the bit line BLa. This current will be detected by the amplifier circuit 7 of the memory, activated in read mode. This circuit will deliver, at output, a corresponding binary state (1 for example) of the memory.

If the reading is done on the bit line BLb, the transistor T12 for its part is off since it is connected to the terminal /Q set at zero. No current flows on this bit line and the amplifier 7 delivers a corresponding binary state (0 in the example) that is complementary to the one read on the line BLa.

Throughout this read operation, the transistors T1 and T2 which connect the bit lines BLa and BLb to the memory cells C1 and C2 of the bistable element are off (EPSEL=0).

To set the static memory element, write means 8 are used. These means include a transistor T13 connected between the bit line BLa and the terminal Q and a transistor T14 connected between the bit line BLb and the terminal /Q (that is, Q bar, or the logical inverse of Q). These two transistors are controlled at their gate by a static memory element write selection signal referenced STSEL. In the example the two transistors T13 and T14 are N type transistors.

If it is sought to set Q at 0 and /Q at 1, there is applied, to the input of the circuit 7 activated in write mode (high voltage switch), a corresponding input data to position the bit line BLb at 1. The bit line BLa is in a state of high impedance like all the other bit lines.

By activating STSEL (=Vcc), the transistors T13 and T14 come on. The transistor T14 switches the line voltage level (at the maximum a level Vcc since its gate is at Vcc) to the corresponding terminal /Q. The terminal Q will automatically follow at zero. When STSEL is deactivated, the static memory element keeps the same state (i.e. in the example Q=0 and /Q=1). If it is sought to set Q at 1 and /Q at 0, it is the line BLb that will be in a state of high impedance and the line BLa that will be positioned at 1.

It will be noted that, normally, the bit line positioned at 1 is taken in practice to a high voltage (of the order of V) by the high voltage switch of the circuit 7.

In the testing phase, however, there is no need for such a level for the static memory element. Should the high voltage Vpp be supplied to an input pad of the memory circuit, it is sufficient to apply a voltage of the order of Vcc for the test. When the operation is in a write phase, the read circuit 6 is deactivated (LST=0). When the operation is in read phase, the write circuit 8 is deactivated (STSEL=0). In both cases, the transistors T1 and T2 are kept off.

Furthermore, transfer gates PG1 and PG2 are designed either to enable the first inverter 4 to follow the output S1 of the bistable element or to set a state in the static memory element.

These two transfer gates are thus controlled in a complementary way, PG1 by the signal STAT, PG2 by the reverse of the signal STAT (referenced in FIG. 2 by a small circle on PG2).

The gate PG1 is mounted as in FIG. 1. The gate PG2 is connected between the output S1 and the terminal Q.

Advantageously, so as not to have disturbances in the write operation, means 9 are planned to discharge the bit lines before they are connected to the terminals Q and /Q of the static memory elements.

Indeed, it is possible that a bit line may be charged, as a result of previous operations.

This bit line could remain charged instead of going into high impedance. If it is connected in this way to a terminal Q and /Q of the static element, there is then a risk of causing deterioration in the final contents of the static element. This is why a discharge transistor is provided for each bit line, to discharge this line before any write operation.

In FIG. 2, there is thus a transistor T15 connected between the bit line BLa and the ground and a transistor T16 connected between the bit line BLb and the ground. In the example, they are N type transistors. They are controlled at their gate by a discharge control signal referenced DECH.

To improve the charging of the contents of the static memory element, it is also possible to provide for a capacitor CAP1, CAP2 connected between each terminal Q, /Q and the ground. Indeed, these capacitors enable compensation for the parasitic capacitances of the bit line.

The structure of the invention described with reference to FIG. 2 enables the performance of a highly complete test of the configuration register. Indeed, it enables the setting of the static memory element associated with each option bit in order to configure the associated option and the testing of this option in this configuration. It thus enables a direct verification of the contents of this static memory element. Finally, it enables writing in the bistable elements with memory cells and the operation of reading in these cells.

All these operations on the static memory elements and on the bistable elements use the same read/write resources of the memory of the integrated circuit.

This structure is therefore compact and provides very full test cover without limiting the performance characteristics of the integrated circuit. In particular, no transistor has been added to the path for the programming of the memory cells. Thus, the high programming voltage is transmitted without additional losses (which could result from the structure of the test).

Figure 3:
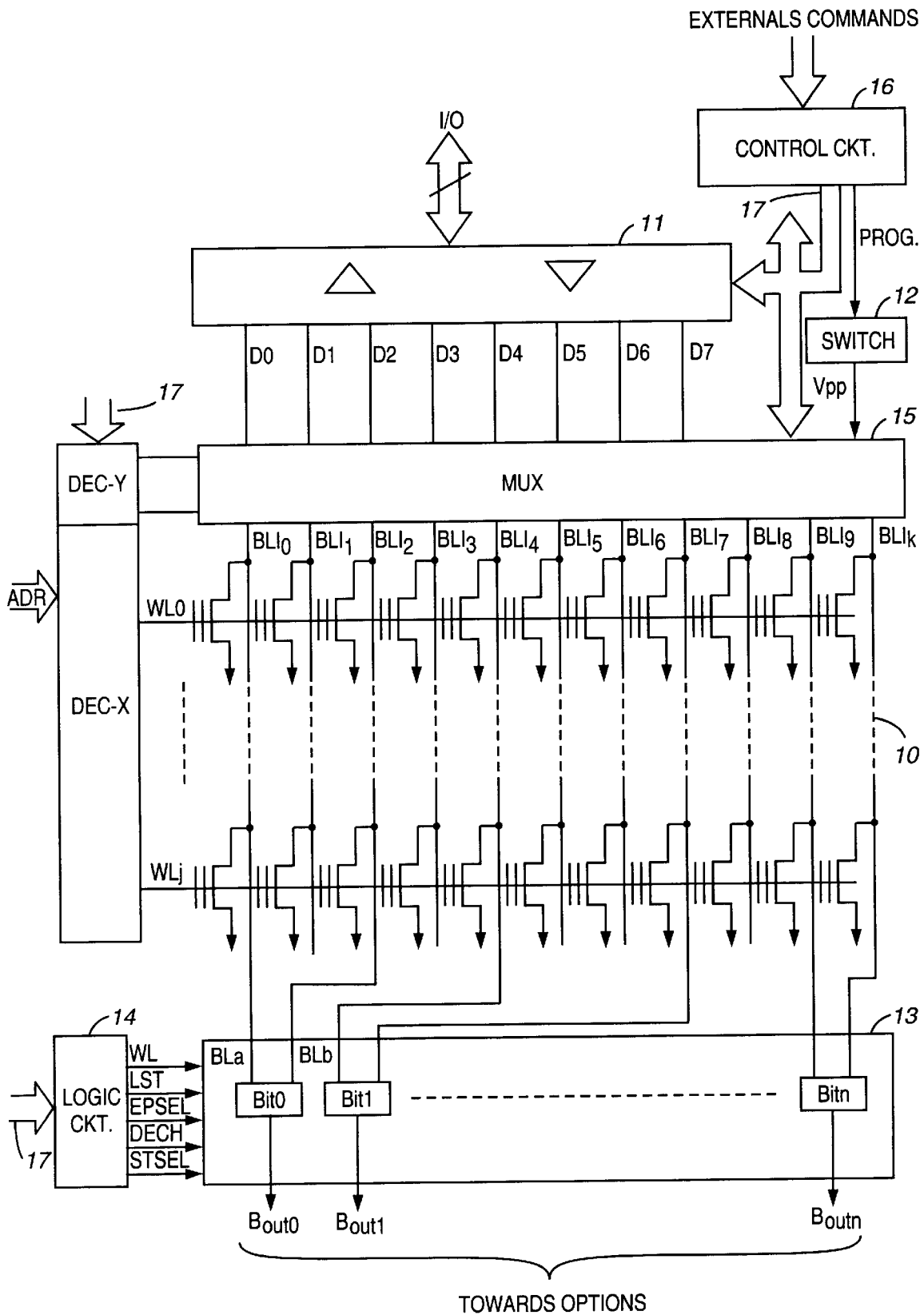
FIG. 3 shows a general block diagram of a memory with a configuration register according to the invention.

FIG. 3 shows a more general diagram of an integrated circuit with a memory and a configuration register according to the invention.

The figure thus shows a standard view of a memory array 10 with its cells organized in bit lines and word lines, the bit line decoder DEC-Y and the word line decoder DEC-X, a gate circuit 15 to apply the appropriate bias voltages to the selected bit lines and to connect them at input or at output to the read/write amplifier circuit 11. A high voltage switch 12 gives the programming voltage Vpp to the gate circuit 15.

A control circuit 16 (microcontroller) gives the different control signals necessary at output 17 as a function of the external commands that it receives. All these elements can be found in the different well-known memory architectures.

The configuration register 13 is controlled by an associated logic circuit 14 controlled by the control circuit 16. In operational mode, the configuration register 13 is thus activated to provide the configuration bit or bits needed for the processing of a command. In test mode, the logic circuit 14 gives the sequence of the signals corresponding to the different test phases (testing of the options, testing of the static memory, and programming tests for the cells of the bistable elements).

Each bit of the configuration register 13 is connected to two different bit lines of the memory array. The choice of the bit lines used depends chiefly on the topology of the circuit and on the decoding facilities.

In the example, the bit 0 is connected to the lines BLi0 and BLi2 of the memory array 10 and the bit 1 is connected to the lines BLi4 and BLi7. The output Bout0, Bout1 of each bit of the configuration register 13 is applied as an input for the configuration of a corresponding option.

The bit lines of the memory 10 make it possible in practice to obtain a very broad configuration register 13 comprising several words (2×16 bits for example or more as needed).

The invention that has just been described can be applied especially, as we have seen, to one-time electrically programmable memories. But it can also be applied to all electrically programmable non-volatile memories in general. In particular, it can be applied to EPROM memories with or without an erasure window (OTP memories). In this case the feature of being erasable/non-erasable is only a characteristic of the package and not a characteristic of the internal electronic circuitry.

Implementing and using an integrated circuit, in accordance with the present invention can be done with hardware, software (including firmware), or a combination of both. Moreover, this functionality may be embodied in computer readable media such as 3.5 inch diskettes to be used in programming an information-processing apparatus to perform in accordance with the invention. This functionality may also be embodied in computer readable media such as a transmitted waveform to be used in transmitting the information or functionality.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. An electrically programmable non-volatile memory integrated circuit comprising:
   read/write resources;
   a first bit line;
   a second bit line;
   an option configuration register comprising at least one bit, the option configuration register comprising, for each bit:
      a bistable element comprising at least one memory cell, wherein the at least one memory cell is coupled to the first bit line and to the second bit line; and
      a static memory element, coupled to the bistable element;
   reading means for reading a state of the static memory element, wherein the reading means utilizes the first and second bit lines and the read/write resources; and
   writing means for setting the state of the static memory element, wherein the setting means utilizes the first and second bit lines and the read/write resources for setting the state of the static memory element.

2. The integrated circuit of claim 1, wherein:
   the static memory element further comprises:
      a ground terminal;
      a first terminal; and
      a second terminal;
   and the reading means comprises:
      a first transistor, coupled to the first bit line, and controlled by a read control signal;
      a second transistor, coupled between the first transistor and the ground terminal, and controlled by the first terminal;
      a third transistor, coupled to the second bit line, and controlled by the read control signal; and
      a fourth transistor, coupled between the third transistor and the ground terminal, and controlled by the second terminal.

3. The integrated circuit of claim 1, wherein:
   the static memory element further comprises:
      a first terminal; and
      a second terminal;
   and the writing means comprises:
      a first transistor, coupled between the first bit line and the first terminal, and controlled by a write control signal; and
      a second transistor, coupled between the second bit line and the second terminal, and controlled by the write control signal.

4. The integrated circuit of claim 3, wherein the writing means further comprises means for discharging the bit lines.

5. The integrated circuit of claim 3, further comprising:
   a ground terminal;
   a first capacitor coupled between the first terminal and the ground terminal; and
   a second capacitor coupled between the second terminal and the ground terminal.

6. The integrated circuit of claim 1, wherein:
   the integrated circuit comprises a plurality of bit lines;
   the option configuration register comprises a plurality of bits;
   the option configuration register comprises, for each of the plurality of bits:
      a bistable element comprising at least one memory cell, wherein the at least one memory cell is coupled to two distinct bit lines of the plurality of bit lines; and
      a static memory element, coupled to the bistable element;
   the reading means comprises a means for individually reading a state of each of the plurality of static memory elements, wherein the reading means selects all of the plurality of static memory elements at the same time utilizing the read/write resources, and utilizes the two distinct bit lines associated with a particular static memory element to read the state of that particular static memory element; and
   the writing means comprises means for individually writing the state to each of the plurality of static memory elements, wherein the writing means selects all of the plurality of static memory elements at the same time utilizing the read/write resources, and utilizes the two distinct bit lines associated with a particular static memory element to write the state to that particular static memory element.

7. A method for testing an option configuration register in an electrically programmable non-volatile memory integrated circuit comprising read/write resources; a first bit line; a second bit line; an option configuration register consisting of at least one bit, the option configuration register comprising, for the at least one bit, a bistable element comprising at least one memory cell, wherein the at least one memory cell is coupled to the first bit line and to the second bit line; and a static memory element, coupled to the bistable element; the method comprising the steps of:

reading a state of the static memory element, wherein the first and second bit lines and the read/write resources are utilized; and setting the state of the static memory element, wherein the first and second bit lines and the read/write resources are utilized.

8. A computer readable medium containing program instructions for testing an option configuration register in an electrically programmable non-volatile memory integrated circuit, wherein the circuit comprises read/write resources; a first bit line; a second bit line; an option configuration register consisting of at least one bit, the option configuration register comprising, for the at least one bit, a bistable element comprising at least one memory cell, wherein the at least one memory cell is coupled to the first bit line and to the second bit line; and a static memory element, coupled to the bistable element; the program instructions comprising instructions for:

reading a state of the static memory element, wherein the first and second bit lines and the read/write resources are utilized; and setting the state of the static memory element, wherein the first and second bit lines and the read/write resources are utilized for setting the state of the static memory element.

* * * * *